United States Patent
Choi et al.

(10) Patent No.: US 7,531,410 B2
(45) Date of Patent: May 12, 2009

(54) SEMICONDUCTOR FLASH MEMORY DEVICE AND METHOD OF FABRICATING THE SAME

(75) Inventors: Yong-Suk Choi, Hwaseong-si (KR);
Jeong-Uk Han, Suwon-si (KR);
Hee-Seog Jeon, Suwon-si (KR);
Seung-Jin Yang, Seoul (KR); Hyok-Ki Kwon, Yongin-si (KR)

(73) Assignee: Samsung Electronic Co., Ltd., Suwon-si, Gyeonggi-do (KR)

( * ) Notice: Subject to any disclaimer, the term of this patent is extended or adjusted under 35 U.S.C. 154(b) by 78 days.

(21) Appl. No.: 11/648,057

(22) Filed: Dec. 29, 2006

(65) Prior Publication Data

US 2007/0278531 A1    Dec. 6, 2007

(30) Foreign Application Priority Data

May 30, 2006    (KR) .................... 10-2006-0048945

(51) Int. Cl.
*H01L 21/336* (2006.01)
(52) U.S. Cl. ..................... 438/259; 438/701
(58) Field of Classification Search .......... 438/257, 438/259, 589, 701
See application file for complete search history.

(56) References Cited

U.S. PATENT DOCUMENTS 5,424,233 A    6/1995    Yang et al.
5,610,091 A *  3/1997    Cho .................. 438/259
6,764,904 B1   7/2004    Liu et al.
6,844,232 B2   1/2005    Choi et al.
2004/0166643 A1* 8/2004  Doan et al. ........... 438/296

FOREIGN PATENT DOCUMENTS

| JP | 2002-118183 | 4/2002 |
| JP | 2002-158299 | 5/2002 |
| KR | 100485485 | 3/2004 |
| KR | 100456702 | 6/2004 |
| KR | 1020040055360 | 6/2004 |

OTHER PUBLICATIONS

English Abstract for Publication No. 2002-118183.
English Abstract for Publication No. 2002-158299.
English Abstract for Publication No. 1020040055360.
English Abstract for Publication No. 1020040025242 (for 10-0485485).
English Abstract for Publication No. 1020040049115 (for 10-0456702).

* cited by examiner

*Primary Examiner*—M. Wilczewski
*Assistant Examiner*—Toniae M Thomas
(74) *Attorney, Agent, or Firm*—F. Chau & Associates, LLC

(57) ABSTRACT

A semiconductor flash memory device. The flash memory device includes a floating gate electrode disposed in a recess having slanted sides in a semiconductor substrate. A gate insulation film is interposed between the floating gate electrode and the semiconductor substrate. A control gate electrode is disposed over the floating gate electrode. The floating gate electrode includes projections adjacent to the slanted sides of the recess.

13 Claims, 7 Drawing Sheets

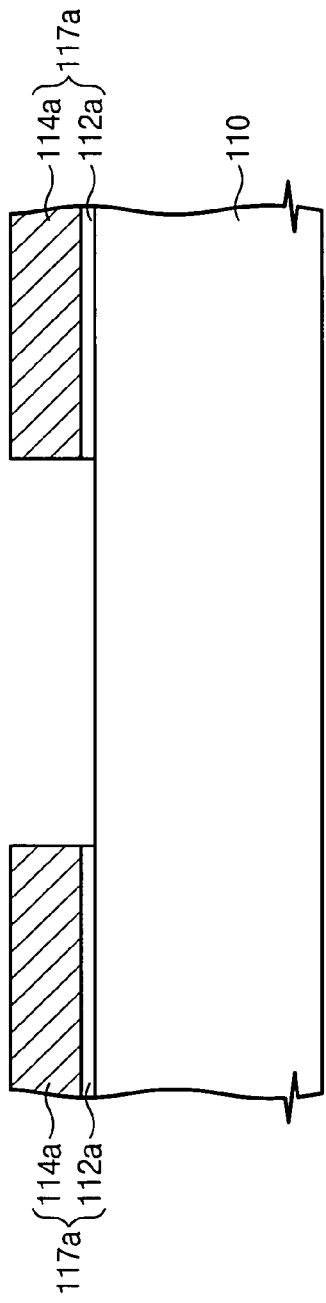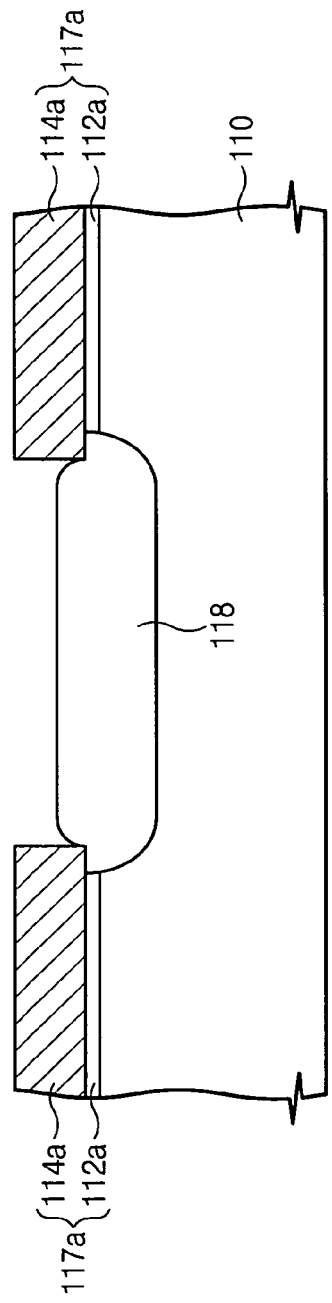

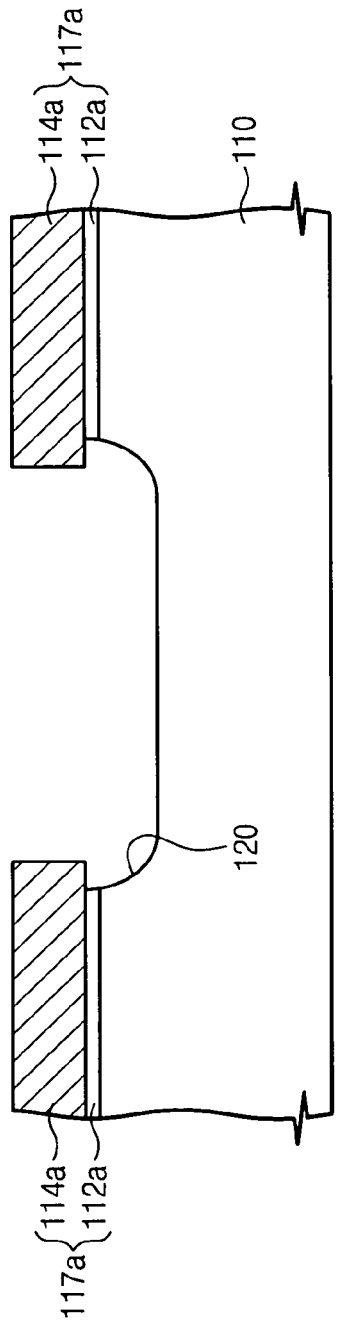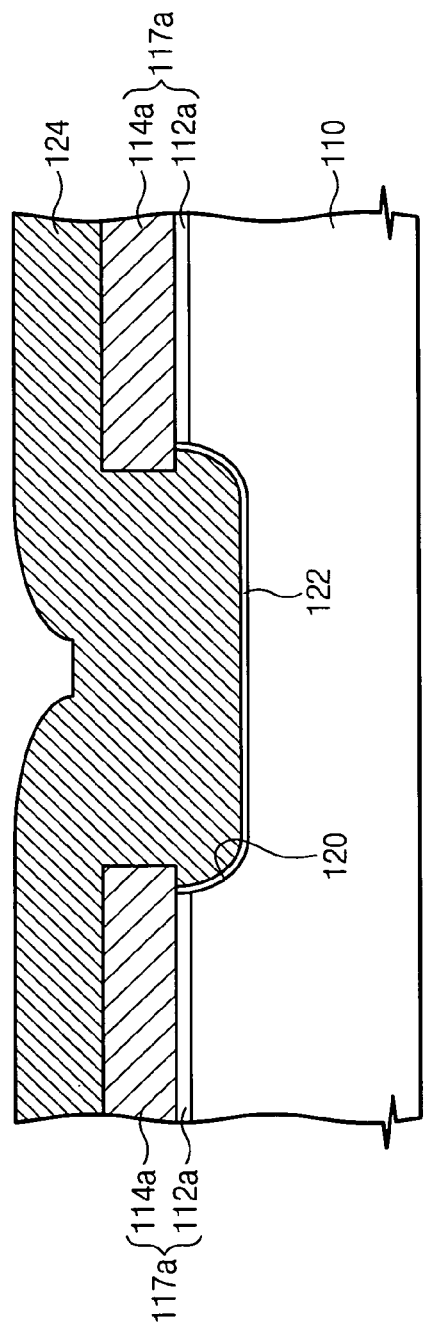

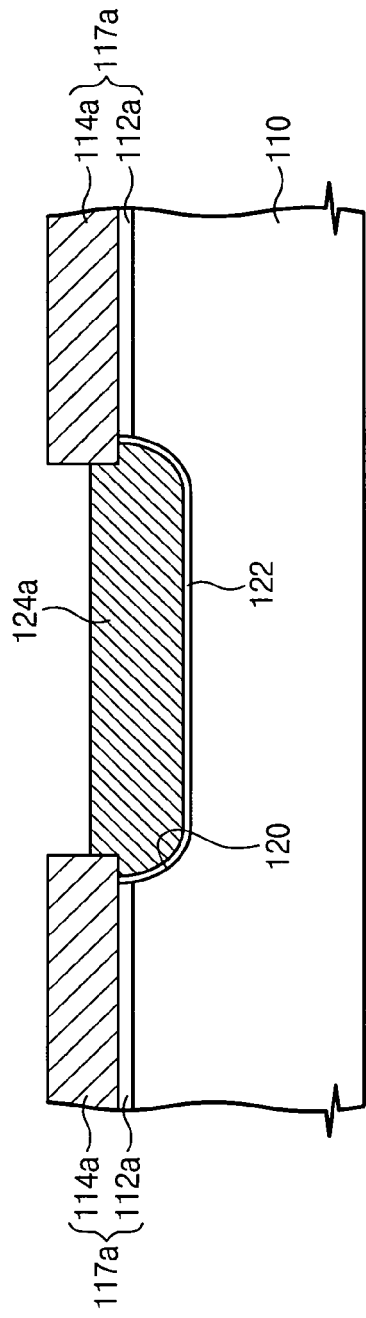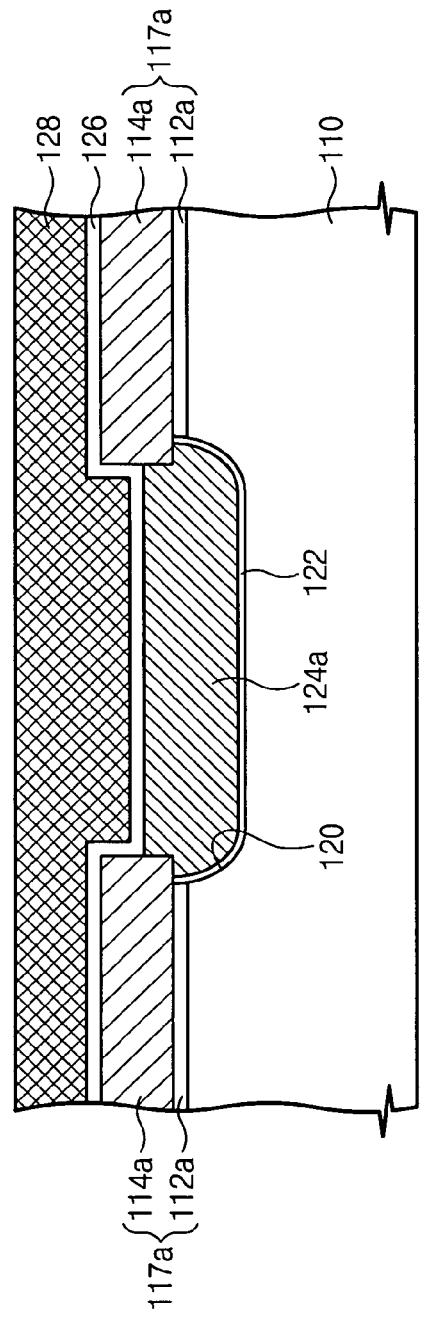

SEMICONDUCTOR FLASH MEMORY DEVICE AND METHOD OF FABRICATING THE SAME

CROSS-REFERENCE TO RELATED APPLICATIONS

This application claims priority under 35 U.S.C. § 119 to Korean Patent Application No. 10-2006-0048945 filed on May 30, 2006, the entire contents of which are hereby incorporated by reference.

BACKGROUND OF THE INVENTION

1. Technical Field

The present disclosure relates to semiconductor devices and more particularly to, a semiconductor flash memory device and method of fabricating the same.

2. Discussion of the Related Art

Semiconductor memory devices can be either volatile or nonvolatile. Volatile semiconductor memory devices lose data stored in memory cells when there is no external power supply. Examples of volatile memory devices include dynamic random access memory (DRAM) and static random access memory (SRAM). Nonvolatile semiconductor memory devices retain their data stored in memory cells even without external power supply. Examples of nonvolatile memory devices include flash memory devices.

Flash memory devices have floating gate electrodes for storing charges and control gate electrodes for discharging or injecting charges from or into the floating gate electrodes. Flash memory devices may be classified into split-gate and stack-gate types.

FIG. 1 is a sectional view illustrating a general split-gate type semiconductor flash memory device.

As shown in FIG. 1, a source region 32s is provided in a predetermined portion of a semiconductor substrate 10 and a pair of floating gate electrodes 24 are provided over the semiconductor substrate 10 adjacent to both sides of the source region 32s. Between the floating gate electrodes 24 and the semiconductor substrate 10 are interposed gate insulation films 22. Field oxide films 18 are laid on the floating gate electrodes 24. As the field oxide films 18 are formed on the floating gate electrode 24, the top edges of the floating gate electrode 24 are shaped in a tip. The reverse sides of the floating gate electrodes 24 to the source region 32s partially overlap with inter-gate insulation films 26 and control gate electrodes 28. The control gate electrodes 28 extend from the floating gate electrodes 24 to predetermined portions that are spaced from the source region 32s in the semiconductor substrate 10. Drain regions 32d are disposed in the semiconductor substrate 10 adjacent to the control gate electrodes 28.

The split-gate type flash memory device is structured such that the floating gate electrode 24 partially overlaps with the control gate electrode 28. The floating gate electrode 24 is completely isolated without any external electrical connection thereto. Data can be stored into the memory cell in the mechanism of current variation through the memory cell by injecting (writing) or discharging (erasing) electrons into or from the floating gate electrode 24.

Injecting electrons into the floating gate electrode 24 is accomplished by applying a high voltage, for example over 15V, and appropriate voltages to the source region 32s and the control gate electrode 28, respectively. Thereby, hot electrons are injected into the floating gate electrode 24 through the gate insulation film 22 from the semiconductor substrate 10 under the floating gate electrode 24. During this, the gate insulation film 22 couples the floating gate electrode 24 with the voltage applied to the source region 32s, boosting a voltage at the floating gate electrode 24.

Discharging electrons from the floating gate electrode 24 is accomplished by applying a high voltage, for example over 15V, to the control gate electrode 28. Thereby, a strong electric field is set on the tip-shaped top edge of the floating gate electrode 24, releasing electrons from the floating gate electrode 24 into the control gate electrode 28. During this, the inter-gate insulation film 26 acts to reduce a coupling ratio between the floating and control gate electrodes 24 and 28, maintaining a large potential gap therebetween.

As such, injecting electrons into the floating gate electrode 24 can be accomplished by channel hot electron injection (CHEI), while discharging electrons from the floating gate electrode 24 can be accomplished by Fowler-Nordheim (F-N) tunneling through the inter-gate insulation film 26 between the floating and control gate electrodes 24 and 28.

As discussed above, the split-gate type flash memory device is structured such that the floating gate electrode partially overlaps with the control gate electrode. When there is miss-alignment during a photolithography process for patterning the control gate electrode, effective lengths of channels through which the control gate electrodes overlap with the semiconductor substrate may be irregular. Operational characteristics may then be non-uniform between memory cells. For example, odd and even-numbered memory cells forming a pair which are arranged symmetrically in a mirror type may not be uniform.

Moreover, as the size of flash memory devices is reduced and integration density of semiconductor apparatuses increases, an effective channel length through which the control gate electrode overlaps with the semiconductor substrate becomes shorter and disturbance characteristics therein degrade.

Additionally, a length of the floating gate electrode becomes shorter, short channel effect may result, degrading the efficiency of operation in the flash memory device.

SUMMARY OF THE INVENTION

The present disclosure is directed to provide a flash memory device suitable for a high integration structure with reduced dimensions.

The present disclosure is also directed to provide a semiconductor flash memory device improving operational efficiency of memory cells therein.

The present disclosure is directed to provide a method of fabricating a flash memory device suitable for a high integration structure with reduced dimensions.

The present disclosure is further directed to provide a method of fabricating a semiconductor flash memory device with satisfactory operational efficiency of memory cells therein.

An exemplary embodiment of the present invention is directed to a semiconductor flash memory device. The flash memory device includes a floating gate electrode disposed in a recess having slanted sides in a semiconductor substrate. A gate insulation film is interposed between the floating gate electrode and the semiconductor substrate. A control gate electrode is disposed over the floating gate electrode. The floating gate electrode includes projections adjacent to the slanted sides of the recess.

The floating gate electrode may include lower and upper floating gate portions. The lower floating gate portion may be configured with sidewalls narrowing downward in width. The upper floating gate portion may be configured with sidewalls narrowing upward in width. The projection may be defined by the sidewalls of the lower and upper floating gate portions.

A curvature radius of the projections may be smaller than a thickness of the lower and upper floating gate portions.

The top of the floating gate electrode may be leveled higher than the semiconductor substrate.

The control gate electrode may include a lower control gate portion narrower than the top of the floating gate electrode in width and an upper control gate portion wider than the top of the floating gate electrode in width.

The semiconductor flash memory device may further include an inter-gate insulation film interposed between the floating gate electrode and the control gate electrode. The inter-gate insulation film may have the same profile as the lower side of the control gate electrode.

The semiconductor flash memory device may further include spacers disposed adjacent to sidewalls of the floating and control gate electrodes and a pair of impurity diffusion regions disposed in the semiconductor substrate adjacent to both sides of the floating gate electrode. The impurity diffusion regions may overlap with the lower sides of the floating gate electrode.

Another exemplary embodiment of the present invention is directed to a method of fabricating a semiconductor flash memory device. The method includes forming a mask pattern to reveal a predetermined portion in a semiconductor substrate. A recess in the revealed portion of the semiconductor substrate is formed. The recess has slanted sides narrowing downward from the surface of the semiconductor substrate. A gate insulation film is formed on the recess. A polysilicon pattern is formed on the gate insulation film. A control gate electrode is formed on the polysilicon pattern. The mask pattern is removed and upper sides of the polysilicon pattern are revealed. A floating gate electrode is formed from the polysilicon pattern. The floating gate electrode may be configured to include a projection adjacent to the slanted sides of the recess.

The floating gate electrode may include lower and upper floating gate portions. The lower floating gate portion may be configured with sidewalls narrowing downward in width. The upper floating gate portion may be configured with sidewalls narrowing upward in width.

Forming the recess may include selectively oxidizing the predetermined portion revealed by the mask pattern and forming a sacrificial oxide film. The sacrificial oxide film is removed.

The sacrificial oxide film may be formed by means of thermal oxidation.

Removing the sacrificial oxide film may be carried out by using an etching method with selectivity to the mask pattern.

Forming the polysilicon pattern may include forming a polysilicon film to cover the mask pattern on the gate insulation film and recessing the polysilicon film to form the polysilicon pattern. The top of the polysilicon pattern may be leveled lower than the top of the mask pattern and higher than the surface of the semiconductor substrate.

An etch-back or chemical-mechanical polishing process is used to recess the polysilicon film.

The polysilicon film is formed of doped polysilicon.

Forming the control gate electrode may include forming an inter-gate insulation film on the polysilicon pattern. A control-gate conductive film is formed to cover the semiconductor substrate on the inter-gate insulation film. The control-gate conductive film and the inter-gate insulation film are patterned. The control gate electrode and an inter-gate insulation pattern are formed.

The control gate electrode may include a lower control gate portion narrower than the top of the floating gate electrode in width. An upper control gate portion is wider than the top of the floating gate electrode in width. A value resulting from dividing a value, which is obtained by subtracting a width of the lower control gate portion from a width of the upper control gate portion, by 2 may be larger than a processing margin in fabricating the semiconductor device.

Forming the floating gate electrode may include thermally oxidizing the disclosed upper sides of the polysilicon pattern and forming a polysilicon oxide film. The polysilicon oxide film is etched. The floating gate electrode may include projections shaped in a tip that have lower sidewalls conforming to a profile of the recess and upper sidewalls generated by etching the polysilicon oxide film.

Etching the polysilicon oxide film may be carried out by using a wet etching process.

The method may further include forming spacers adjacent to sidewalls of the floating and control gate electrodes. A pair of impurity diffusion regions is formed in the semiconductor substrate adjacent to both sides of the floating gate electrode. The impurity diffusion regions may overlap with the lower sides of the floating gate electrode.

A further understanding of the nature and features of the present disclosure herein may be realized by reference to the exemplary embodiments of the present invention disclosed in the specification and in the attached drawings.

BRIEF DESCRIPTION OF THE DRAWINGS

The accompanying figures are included to provide a further understanding of the present disclosure, and are incorporated in and constitute a part of this specification. The drawings illustrate exemplary embodiments of the present invention and, together with the description, serve to explain principles of the present disclosure. In the figures:

FIGS. 2A through 2L are sectional views illustrating a process for fabricating a stack-gate type semiconductor flash memory device in accordance with an exemplary embodiment of the present invention.

DETAILED DESCRIPTION OF THE EXEMPLARY EMBODIMENTS

Figure 1:
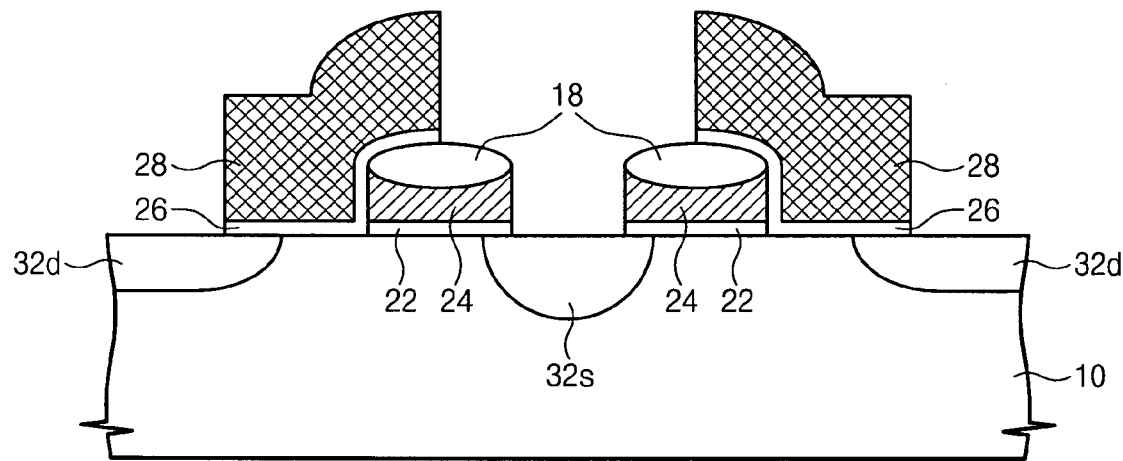
FIG. 1 is a sectional view illustrating a general split-gate type semiconductor flash memory device.

Exemplary embodiments of the present invention will be described below in more detail with reference to the accompanying drawings. The present disclosure may, however, be embodied in different forms and should not be constructed as limited to the embodiments set forth herein. Rather, these embodiments are provided so that this disclosure will be thorough and complete, and will fully convey the scope of the present disclosure to those skilled in the art.

In the figures, the dimensions of layers and regions may be exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. In the figures, like reference numerals refer to like elements throughout.

FIGS. 2A through 2L are sectional views illustrating a process for fabricating a stack-gate type semiconductor flash memory device in accordance with an exemplary embodiment of the present invention.

Figure 2A:
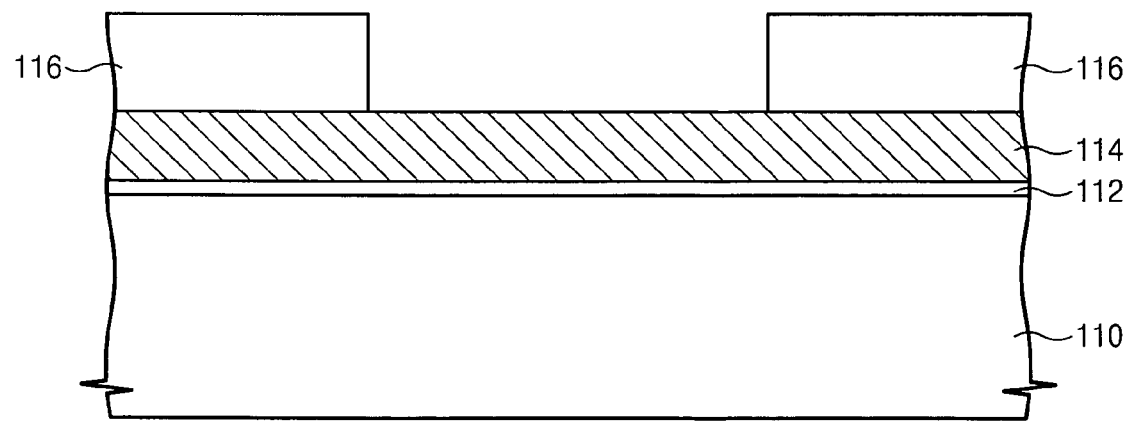

Referring to FIG. 2A, a device isolation film (not shown) is formed to confine an active region in a semiconductor substrate 110. On the active region, a pad oxide film 112 and a pad nitride film 114 are deposited in sequence. The pad oxide film 112, for example, may be made of silicon oxide ($SiO_2$) formed by thermal oxidation. The pad nitride film 114, for example, may be made of silicon nitride ($Si_xN_y$) formed by chemical-mechanical deposition (CVD).

A photoresist pattern 116 is arranged on the pad nitride film 114 and the pad oxide film 112. The photoresist pattern 116, the pad nitride film 114 and the pad oxide film 112 are deposited in sequence. The photoresist pattern 116 may be used to define a mask pattern for forming a sacrificial oxide film in the later processing step.

Referring to FIG. 2B, the pad nitride film 114 and the pad oxide film 112 are partially etched away using the photoresist pattern 116 as a mask. Thereby, a mask pattern 117a is formed including an opening to reveal a predetermined portion of the semiconductor substrate 110. The mask pattern 117a is comprised of a pad oxide pattern 112a and a pad nitride pattern 114a. After forming the mask pattern 117a, the photoresist pattern 116 is removed therefrom.

Referring to FIG. 2C, the predetermined portion of the semiconductor substrate 110, revealed by the mask pattern 117a as a mask, is oxidized to form a sacrificial oxide film 118. The sacrificial oxide film 118 may be made of silicon oxide formed by thermal oxidation.

The process step of revealing and oxidizing the predetermined portion (surface) of the semiconductor substrate 110 with the mask pattern 117a as a mask is referred to as LOCal Oxidation of Silicon (LOCOS). The sacrificial oxide film 118 formed through the LOCOS process would extend to the underside of the pad nitride pattern 114a of the mask pattern 117a due to a bird's beak effect. According to this, the sacrificial oxide film 118 may be composed of an upper sacrificial oxide film disposed in the mask pattern 117a, and a lower sacrificial oxide film extending to the lower side of the pad nitride pattern 114a under the upper sacrificial oxide film.

Thereafter, referring to FIG. 2D, the sacrificial oxide film 118 is removed therefrom by means of an etching process with using the pad nitride pattern 114a of the mask pattern 117a as a mask. Thereby, a recess 120 is formed with slanted sides at predetermined portion of the semiconductor substrate 110. The etching method for removing the sacrificial oxide film 118 may be a wet etching process using compound solution of ammonium fluoride ($NH_4F$) and hydro-fluoride (HF) as an etchant.

Next, referring to FIG. 2E, a gate insulation film 122 is formed on the recess 120. The gate insulation film 122 may be made of silicon oxide formed by means of thermal oxidation. Then, a polysilicon film 124 is deposited to cover the mask pattern 117a, filling the recess 120 on which the gate insulation film 120 is formed. The polysilicon film 124 may be formed of doped polysilicon.

Referring to FIG. 2F, the polysilicon film 124 is recessed to form a polysilicon pattern 124a leveled higher than the surface of the semiconductor substrate 110. Recessing the polysilicon film 124 may be accomplished by means of an etchback or chemical-mechanical polishing (CMP) process.

The polysilicon pattern 124a is leveled higher than the surface of the semiconductor substrate 110 and lower than the top of the mask pattern 117a to prevent miss-alignment therein by self-aligning the control gate electrode through the subsequent processing step.

Referring to FIG. 2G, an inter-gate insulation film 126 is formed to cover the semiconductor substrate 110 on the polysilicon pattern 124a. The inter-gate insulation film 126 may be formed of at least one or more layers of silicon oxide and/or silicon nitride. According to an exemplary embodiment of the present invention, the inter-gate insulation film 126 may be a triple film with sequentially stacked oxide-nitride-oxide (ONO) or a silicon oxide film deposited by means of thermal oxidation and medium-temperature oxidation (MTO). The inter-gate insulation film 126 may be configured like the lower profile made by the polysilicon pattern 124a and the mask pattern 117a.

Next, a control-gate conductive film 128 is deposited on the inter-gate insulation film 126, covering the semiconductor substrate 110. The control-gate conductive film 128 may be formed of conductive materials such as polysilicon and/or metal. According to an exemplary embodiment of the present invention, the control-gate conductive film 128 may be formed of a polycide film made by sequentially stacking a polysilicon film and a metal silicide film thereon.

Figure 2H:
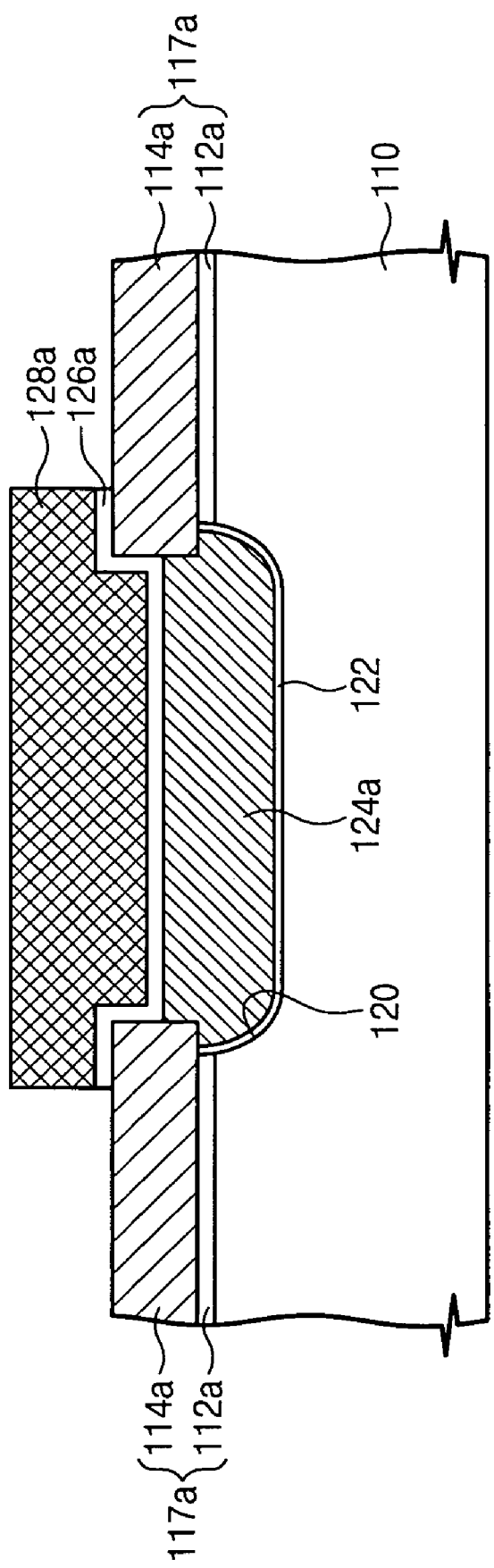

Referring to FIG. 2H, a photoresist pattern (not shown) is arranged on the control-gate conductive film 128. Using the photoresist pattern as a mask, the control-gate conductive film 128 and the inter-gate insulation film 126 are sequentially patterned to form a control gate electrode 128a and an inter-gate insulation pattern 126a. As discussed above in conjunction with FIG. 2F, the control gate electrode 128a may be formed with self-alignment to the polysilicon pattern 124a.

The control gate electrode 128a may comprise a lower control gate portion narrower than the opening of the mask pattern 117a in width, and an upper control gate portion wider than the opening of the mask pattern 117a in width. Here, a value resulting from dividing a value, which is obtained by subtracting a width of the lower control gate portion from a width of the upper control gate portion, by 2 may be larger than a processing margin in fabricating the semiconductor device.

The inter-gate insulation pattern 126a may be configured to have the same profile as the lower side of the control gate electrode 128a.

Figure 2I:
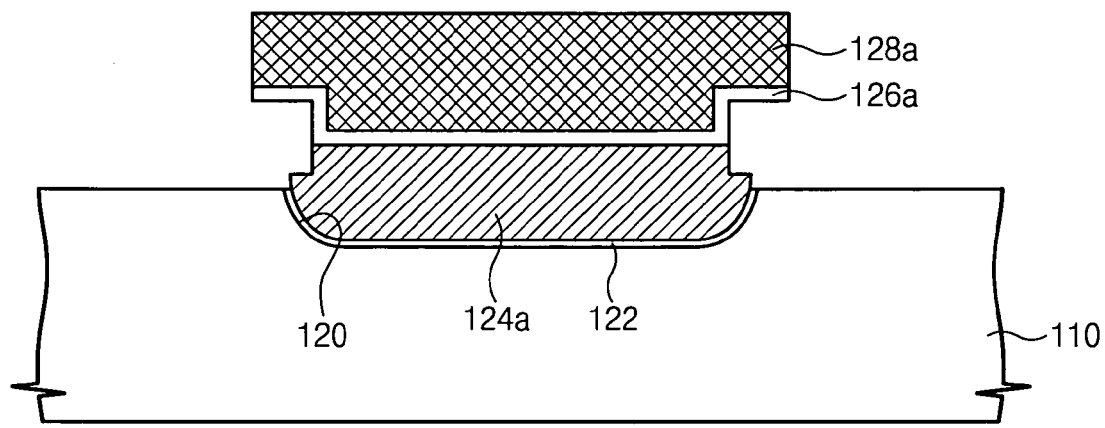

After forming the control gate electrode 128a, referring to FIG. 2I, the mask pattern 117a is removed to completely reveal the sides of the polysilicon pattern 124a and the-control gate electrode 128a. The pad nitride pattern 114a of the mask pattern 117a can be removed by means of a wet etching mode with an etchant containing phosphoric acid ($H_3PO_4$). During this wet etching process, the pad oxide pattern 112a, the gate insulation film 122, and the inter-gate insulation pattern 126a which are adjacent to the pad nitride pattern 114a may each be partially removed. Accordingly, if the inter-gate insulation pattern 126a is made of the triple ONO film, it may be changed into a dual film of nitride and oxide at the sidewalls of the upper and lower control gate portions.

Figure 2J:
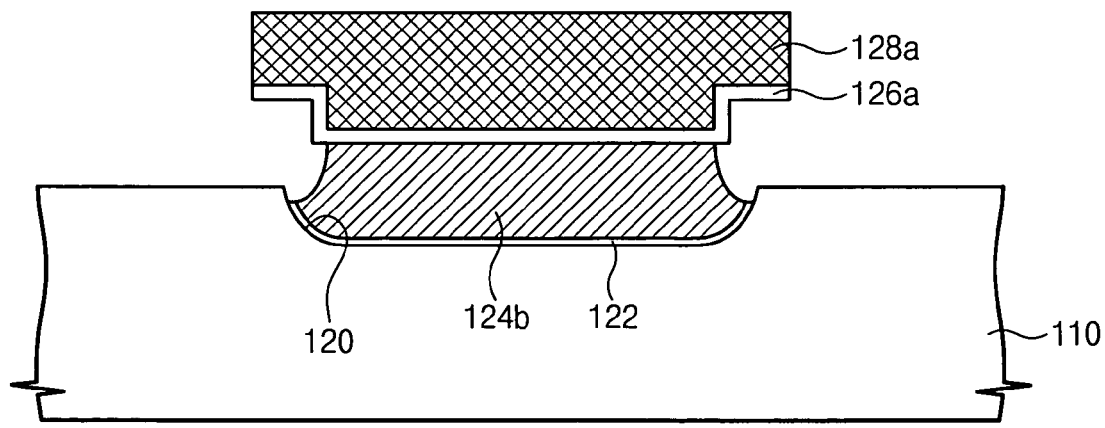

Referring to FIG. 2J, the polysilicon pattern 124a is thermally oxidized to form a polysilicon oxide film (not shown). This polysilicon oxide film may be formed by means of rapid thermal oxidation (RTO). According to an exemplary embodiment of the present invention, this process of thermal oxidation may be carried out in the temperature range of approximately 700° C.-950° C. and the polysilicon oxide film formed herein may be formed within the thickness range of approximately 20 Å-100 Å. If the control gate electrode 128a is made of polysilicon, the polysilicon oxide film may also be generated on the outwardly revealed surface of the control gate electrode 128a. The polysilicon oxide film formed by RTO grows upward and downward from the revealed surface of the polysilicon pattern 124a, as like the case by LOCOS described above and illustrated in FIG. 2C.

Then, the polysilicon oxide film is etched away to form a floating gate electrode 124b. Etching the polysilicon oxide film may be accomplished by a wet etching process. The floating gate electrode 124b may be composed of lower and upper floating gate portions. The lower floating gate portion may be configured with sidewalls gradually narrowing downward in width along the profile of the recess 120. The upper floating gate portion may be configured with sidewalls gradually narrowing upward in width by etching the polysilicon oxide film.

Such sidewalls of the lower and upper floating gate portions define projections extending toward slanted sides of the recess 120 at both sides of the floating gate electrode 124b. As the projections have a curvature radius smaller than those of the sidewalls of the lower and upper floating gate portions, the floating gate electrode 124b is formed into a tip. The floating gate electrode 124b is able to achieve desirable operational characteristics of erasure in the flash memory device owing to the tip pattern.

Figure 2K:
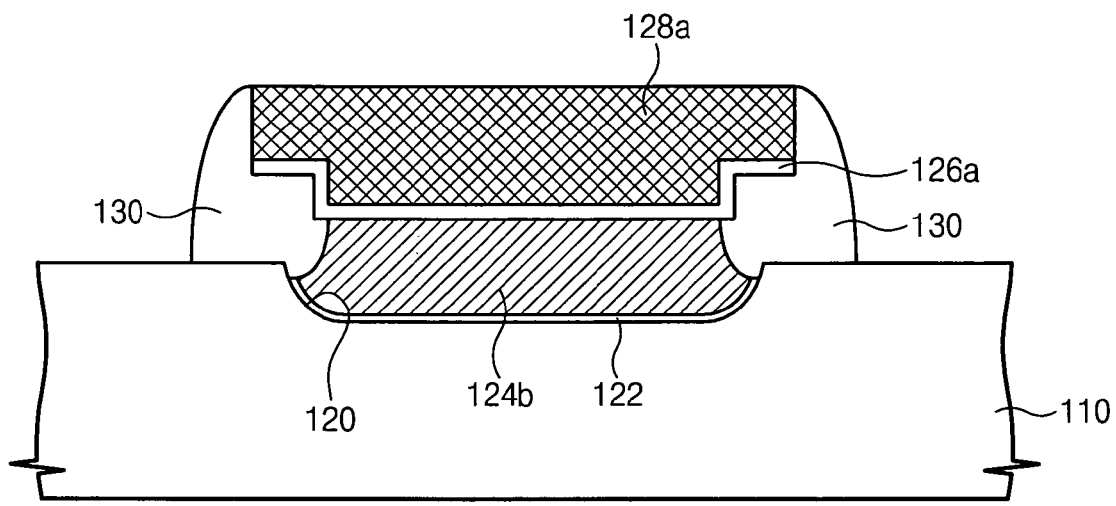
Figure 2L:
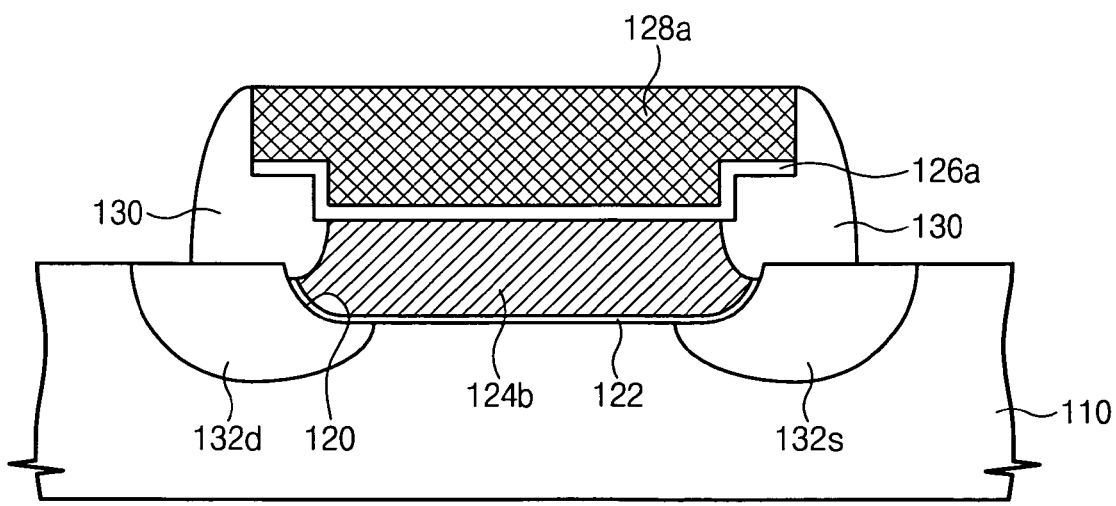

Then, referring to FIGS. 2K and 2L, after forming an insulative spacer film (not shown) covering the semiconductor substrate 110 and filling both sides of the control gate electrode 128a and the floating gate electrode 124b with the tipped projections on its sides, the insulative spacer film is etched to form spacers 130 adjacent to both sides of the floating and control gate electrodes 124b and 128a. The insulative spacer film may be a silicon oxide film.

Using the spacers 130 as a mask, an ion implantation process is carried out to form a pair of impurity diffusion regions 132s and 132d in the semiconductor substrate 110 at both sides of the floating gate electrode 124b. The pair of impurity diffusion regions 132s and 132d functions as source and drain regions. The impurity diffusion regions 132s and 132d may be formed to overlap the lower portion of the floating gate electrode 124b. An overlap between the impurity diffusion regions 132s and 132d and the lower portion of the floating gate electrode 124b may be designed in a degree capable of enclosing the projections formed at both sides of the floating gate electrode 124b.

In writing data into a memory cell, the impurity diffusion regions 132s and 132d, which may be a source region 132s and a drain region 132d are supplied with a high voltage and an appropriate bias voltage and hot electrons generated thereby are injected through the gate insulation film 122 into the floating gate electrode 124b from the semiconductor substrate 110 under the floating gate electrode 124b adjacent to the control gate electrode 128a. During this, the inter-gate insulation pattern 126a couples a voltage of the control gate electrode 128a with the floating gate electrode 124b, raising a potential of the floating gate electrode 124b.

On the other hand, in erasing data from a memory cell, a voltage over 15V applied to the source region 132s generates a strong electric field on the tip at the edge of the floating gate electrode 124b forcing electrons to become discharged into the source region 132s from the floating gate electrode 124b.

As such, injecting electrons into the floating gate electrode 124b is accomplished by the mechanism of CHEI and discharging electrons from the floating gate electrode 124b is accomplished in the mechanism of F-N tunneling through the gate insulation film 122 between the floating gate electrode 124b and the source region 132s.

As a result, the methodological and structural features according to the aforementioned exemplary embodiment of the present invention minimize miss-alignment that would be generated while fabricating memory cells of the flash memory device. Further, the projections may extend toward the source and drain regions at both sides of the floating gate electrode in the memory cell. The semiconductor flash memory device and method of fabricating the same described herein with reference to exemplary embodiments of the present invention may minimize or prevent miss-alignment of memory cells having a reduced size and a high integration density.

Moreover, the projection formed on the floating gate electrode contributes to the strength of operational efficiency of the memory cell.

The above-disclosed subject matter is to be considered illustrative, and not restrictive, and the appended claims are intended to cover all such modifications, enhancements, and other embodiments, which fall within the true spirit and scope of the present disclosure.

What is claimed is:

1. A method of fabricating a semiconductor flash memory device, comprising:
   forming a mask pattern to reveal a predetermined portion of a semiconductor substrate;
   forming a recess in the revealed portion of the semiconductor substrate, the recess having slanted sides narrowing downward from the surface of the semiconductor substrate;
   forming a gate insulation film on the recess;
   forming a polysilicon pattern on the gate insulation film;
   forming a control gate electrode on the polysilicon pattern;
   removing the mask pattern and revealing upper sides of the polysilicon pattern; and
   forming a floating gate electrode from the polysilicon pattern,
   wherein the floating gate electrode comprises projections adjacent to the slanted sides of the recess.

2. The method as set forth in claim 1, wherein the floating gate electrode comprises a lower floating gate portion and an upper floating gate portion, wherein the lower floating gate portion is configured with sidewalls narrowing downward, wherein the upper floating gate portion is configured with sidewalls narrowing upward.

3. The method as set forth in claim 1, wherein forming the recess is comprised of:
   selectively oxidizing the predetermined portion revealed by the mask pattern and forming a sacrificial oxide film; and
   removing the sacrificial oxide film.

4. The method as set forth in claim 3, wherein the sacrificial oxide film is formed by means of thermal oxidation.

5. The method as set forth in claim 3, wherein removing the sacrificial oxide film comprising using an etching method with selectivity to the mask pattern.

6. The method as set forth in claim 1, wherein forming the polysilicon pattern is comprised of:
   forming a polysilicon film to cover the mask pattern on the gate insulation film; and
   recessing the polysilicon film to form the polysilicon pattern,
   wherein the top of the polysilicon pattern is leveled lower than the top of the mask pattern and higher than the surface of the semiconductor substrate.

7. The method as set forth in claim 6, wherein recessing the polysilicon film comprising using an etch-back or chemical-mechanical polishing process.

8. The method as set forth in claim 6, wherein the polysilicon film is formed of doped polysilicon.

9. The method as set forth in claim 1, wherein forming the control gate electrode is comprised of:
- forming an inter-gate insulation film on the polysilicon pattern;
- forming a control-gate conductive film to cover the semiconductor substrate on the inter-gate insulation film; and
- patterning the control-gate conductive film and the inter-gate insulation film and forming the control gate electrode and an inter-gate insulation pattern.

10. The method as set forth in claim 9, wherein the control gate electrode comprises:
- a lower control gate portion narrower than the top of the floating gate electrode; and
- an upper control gate portion wider than the top of the floating gate electrode,
- wherein a result of dividing a value, which is obtained by subtracting a width of the lower control gate portion from a width of the upper control gate portion, by 2 is larger than a processing margin in fabricating the semiconductor device.

11. The method as set forth in claim 1, wherein forming the floating gate electrode is comprised of:
- thermally oxidizing the revealed upper sides of the polysilicon pattern and forming a polysilicon oxide film; and
- etching the polysilicon oxide film,
- wherein the floating gate electrode includes the projections shaped in a tip that have lower sidewalls conforming to a profile of the recess and upper sidewalls generated by etching the polysilicon oxide film.

12. The method as set forth in claim 11, wherein etching the polysilicon oxide film comprises a wet etching process.

13. The method as set forth in claim 1, further comprising:
- forming spacers adjacent to sidewalls of the floating and control gate electrodes; and
- forming a first impurity diffusion region in the semiconductor substrate adjacent to a first side of the floating gate electrode and forming a second impurity diffusion region in the semiconductor substrate adjacent to a second side of the floating gate electrode,
- wherein the first and second impurity diffusion regions overlap with the lower sides of the floating gate electrode.

* * * * *